United States Patent
Brown et al.

(10) Patent No.: US 6,695,886 B1
(45) Date of Patent: Feb. 24, 2004

(54) OPTICAL PATH IMPROVEMENT, FOCUS LENGTH CHANGE COMPENSATION, AND STRAY LIGHT REDUCTION FOR TEMPERATURE MEASUREMENT SYSTEM OF RTP TOOL

(75) Inventors: Douglas Brown, South Hamilton, MA (US); Robert David Meadows, Portland, OR (US); David Tao, Saugus, MA (US); Mathias Koch, Andover, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 33 days.

(21) Appl. No.: 10/225,590

(22) Filed: Aug. 22, 2002

(51) Int. Cl.[7] ............... G01J 5/08; G01J 5/38; G01J 5/04; G01K 1/14; F27B 5/00
(52) U.S. Cl. ............ 374/130; 374/208; 374/187; 374/121; 219/390
(58) Field of Search .............. 374/121, 125, 374/130, 131, 187, 208; 219/201, 444.1, 494, 446.1, 390, 505, 511, 392, 416, 418

(56) References Cited

U.S. PATENT DOCUMENTS

| | | | | |
|---|---|---|---|---|
| 5,161,894 A | * | 11/1992 | Bourigault | 374/185 |
| 5,556,204 A | * | 9/1996 | Tamura et al. | 374/161 |
| 5,645,351 A | * | 7/1997 | Nakata et al. | 374/161 |
| 5,662,418 A | * | 9/1997 | Deak et al. | 374/144 |
| 5,796,066 A | * | 8/1998 | Guyot | 219/121.48 |
| 5,880,922 A | * | 3/1999 | Husain | 361/234 |
| 6,035,100 A | * | 3/2000 | Bierman et al. | 392/416 |
| 6,084,215 A | * | 7/2000 | Furuya et al. | 219/444.1 |
| 6,086,246 A | * | 7/2000 | Shufflebotham et al. | 374/121 |
| 6,110,288 A | * | 8/2000 | Penelop et al. | 118/724 |
| 6,179,465 B1 | * | 1/2001 | Yam | 374/2 |
| 6,306,455 B1 | * | 10/2001 | Takamori et al. | 427/8 |
| 6,375,348 B1 | | 4/2002 | Hebb et al. | |
| 6,481,886 B1 | * | 11/2002 | Narendrnath et al. | 374/141 |
| 6,515,261 B1 | * | 2/2003 | Smargiassi et al. | 219/390 |
| 6,543,934 B1 | * | 4/2003 | Hammer et al. | 374/134 |
| 6,575,622 B2 | * | 6/2003 | Norrbakhsh et al. | 374/141 |

* cited by examiner

*Primary Examiner*—Gail Verbitsky
(74) *Attorney, Agent, or Firm*—Eschweiler & Associates, LLC (57) ABSTRACT

The present invention is directed to a pyrometer system and comprises an elevator tube. The elevator tube comprises an inner tube and an outer tube surrounding the inner tube in telescoping arrangement and extending from a top to a bottom thereof, the arrangement defining a fluid passageway therebetween. The elevator tube further comprises a port associated with the outer tube that is operable to transmit a cooling gas therethrough into the fluid passageway. A pyrometer head is coupled to the bottom of the inner tube and is operable to transmit and receive radiation through the inner tube. The system further comprises a spider collar coupled to at least one of a top of the inner tube or outer tube, and is operable to support a work piece for thermal measurement thereof.

27 Claims, 6 Drawing Sheets

FIG. 6 though interference effects, which can lead to temperature measurement errors during processing. Furthermore, the emissivity of the wafer is also dependent on the backside surface roughness and wafer temperature. All of these drawbacks make the determination or prediction of wafer emissivity a difficult task.

OPTICAL PATH IMPROVEMENT, FOCUS LENGTH CHANGE COMPENSATION, AND STRAY LIGHT REDUCTION FOR TEMPERATURE MEASUREMENT SYSTEM OF RTP TOOL

FIELD OF THE INVENTION

The present invention relates generally to semiconductor processing systems, and more particularly to a pyrometer system for measuring a wafer temperature employed in a rapid thermal processing (RTP) tool.

BACKGROUND OF THE INVENTION

Thermal processing furnaces have been widely known and used for many years to perform a variety of semiconductor fabrication processes, including annealing, diffusion, oxidation, and chemical vapor deposition. As a result, these processes are well understood, especially with regard to the impact of process variables on the quality and uniformity of resulting products. Thermal processing furnaces typically employ either a horizontal-type furnace or a vertical-type furnace.

Both conventional types of furnaces are designed to heat semiconductor wafers to desired temperatures to promote either diffusion of implanted dopants to a desired depth while maintaining substantially small line widths (e.g., smaller than 1 micron), or to perform other conventional processing techniques, such as the application of an oxide layer to the wafer or deposition of a chemical vapor layer to the wafer. The heating requirements of the wafer during processing are known and well understood, and therefore are closely monitored.

Conventional vertical-type thermal processing furnaces, such as tube furnaces, are designed to support the processing tube within the furnace in the vertical position. The thermal furnace also typically employs a wafer boat assembly that is mounted to appropriate translation mechanisms for moving the wafer boat into and out of the processing tube. A wafer-handling assembly is deployed adjacent and parallel to the wafer-boat assembly to transfer the semiconductor wafers from wafer cassettes to the wafer-boat assembly. The wafers are then raised into a quartz or silicon heating tube. The tube is then slowly raised to the desired temperature and maintained at that temperature for some pre-determined period of time. Afterwards, the tube is then slowly cooled, and the wafers are removed from the tube to complete the processing. A drawback of this processing technique is that it places constraints on the time-at-temperature to which a wafer can be subjected.

As the critical dimensions for silicon integrated circuits are continuously scaled downward into the sub-micron regime, requirements for within wafer temperature uniformity and wafer-to-wafer temperature repeatability become more stringent. For example, in 0.18 micron technology, the required wafer-to-wafer temperature repeatability is in the order of about +/-3° C.

Pyrometry has been one method of choice for non-contact temperature measurements of a silicon wafer during processing in a thermal processing furnace. Pyrometry is based on the principle that all objects at temperatures above absolute zero emit electromagnetic radiation as a function of temperature in accordance with Planck's equation. Based upon that relationship, the temperature of an object may be determined from a distance by measuring its emitted radiation. However, the spectral emissivity value of the surface being measured must be known to calculate the actual temperature. Typically, silicon wafers have backside layers that can drastically alter the spectral emissivity of the wafer through interference effects, which can lead to temperature measurement errors during processing. Furthermore, the emissivity of the wafer is also dependent on the backside surface roughness and wafer temperature. All of these drawbacks make the determination or prediction of wafer emissivity a difficult task.

One technique employed to accurately measure the wafer temperature using pyrometry comprises modified single-color pyrometry with wafer emissivity compensation. An exemplary prior art pyrometry system using such compensation is illustrated in prior art FIG. 1, and designated at reference numeral 10. The single-color pyrometer 10 includes an elevator tube 12 (not shown to scale) having a spider collar 14 coupled to a top portion 16 thereof. The spider collar 14 has several legs 18 (e.g., three (3)) and holds a wafer 20 at a predetermined distance from the tube 12. The spider collar 14 may further hold an edge ring (not shown) that may be employed for wafer edge temperature uniformity control.

Figure 1:
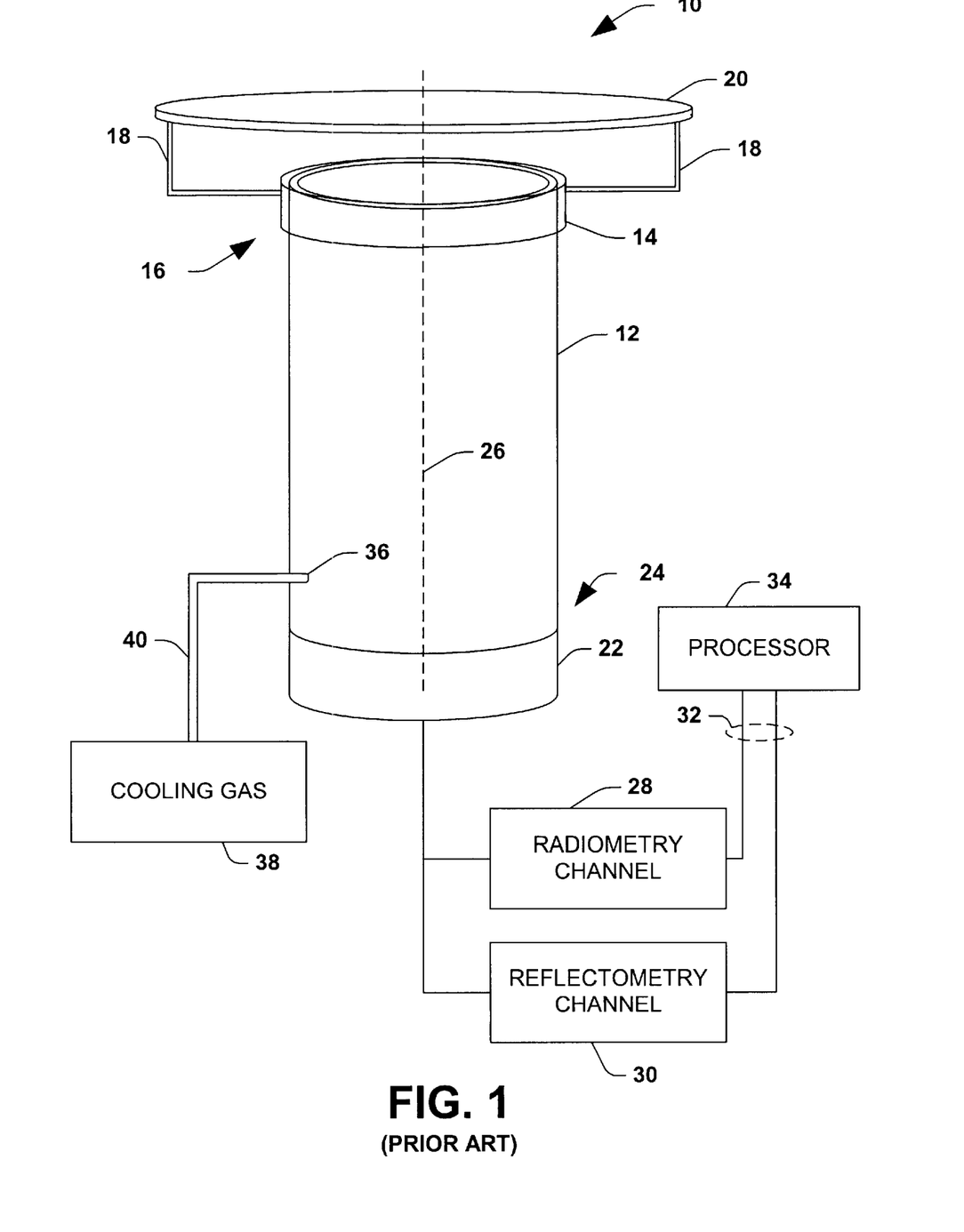
FIG. 1 is a combined perspective view and block diagram of a prior art pyrometer system.

A pyrometer head 22 is coupled to a bottom portion 24 of the elevator tube 12. The pyrometer head 22 contains an optical system (e.g., a number of lenses and apertures) that facilitates a flash emission to the wafer 20 and receipt of emitted and reflected light along or parallel to an optical axis 26. The head 22 operates in conjunction with a radiometry channel 28 and a reflectometry channel 30 which communicate signals 32 to a processor 34 for determination of the wafer temperature.

In addition, the pyrometry system includes a port 36 coupled to the elevator tube 12 for the introduction of cooling gas 38, such as nitrogen, thereto through, for example, a supply line 40. Because a bell jar (not shown) is typically used to heat the wafer 20, non-uniform heating of the wafer can occur, causing a center portion thereof to become hotter than peripheral areas. The elevator tube 12 delivers the cooling gas 38 to a center portion of the wafer 20 via the port 36 to assist in temperature uniformity thereat.

In operation, the pyrometry system 10 employs the radiometry channel 28 and the reflectometry channel 30 to determine the wafer temperature in the following exemplary manner. The radiometry channel 28 records the intensity of radiation emitted from the wafer 20 as well as radiation originating from stray light from the bell jar (not shown) and reflected from the wafer. The reflectometry channel 30 records the reflection intensity associated with a flash generated by the pyrometer head 22. The channels 28, 30 deliver the emission data and reflectivity data to the processor 34 that subtracts the stray light from the radiometry signal to obtain the black body intensity of the wafer. The processor 34 further calculates the wafer emissivity by assuming the emissivity is the complement of the wafer reflectivity, and thus extracts the wafer emissivity from the reflectometry signal. The wafer temperature is then calculated or otherwise determined by the processor 34 by dividing the black body intensity by the wafer emissivity.

As seen in prior art FIG. 1, the central optical element of the pyrometer system 10 is the pyrometer head 22. Since the head 22 is mounted at the bottom of the elevator tube 12 to thermally isolate the components therein from the work piece that is at an elevated temperature, the optical path between the wafer 20 and the head 22 is relatively long, for example, about 1 meter. The relatively long separation between the wafer 20 and the head 22 requires that the wafer be extremely carefully aligned such that the wafer normal and the head 22 are aligned with the optical axis 26. Even a small angle or offset of the wafer normal with respect to the axis 26 causes a loss in reflected and emitted signal intensity, thereby adversely impacting temperature calculation accuracy.

Figure 2A:
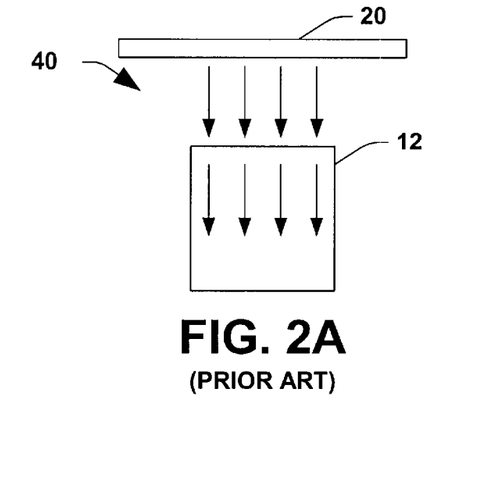
FIG. 2A is a simplified cross section of a portion of the prior art pyrometer system of FIG. 1, wherein light from a work piece enters the elevator tube in a relatively aligned fashion.
Figure 2B:
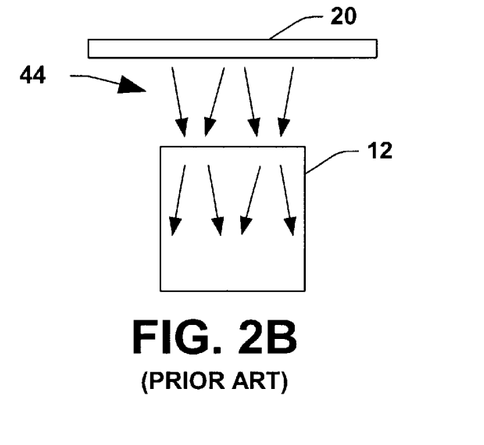
FIG. 2B is a simplified cross section of a portion of the prior art pyrometer system of FIG. 1, wherein light from a work piece enters the elevator tube in a relatively non-aligned fashion.
Figure 2C:
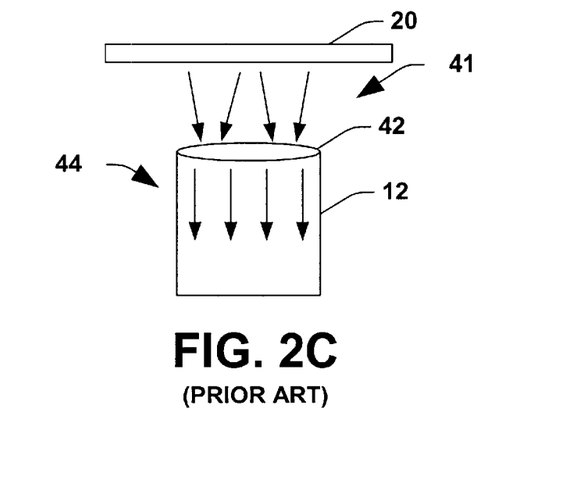
FIG. 2C is a simplified cross section of a portion of the prior art pyrometer system of FIG. 1, wherein light from a work piece approaches the elevator tube in a relatively non-aligned fashion and is subsequently aligned using a lens.

For example, as illustrated in prior art FIGS. 2A and 2B, if the wafer 20 is not warped or offset (FIG. 2A) the radiation 40 is fully collected at the bottom 24 of the tube 12 by the head 22, while wafer warpage or offset (FIG. 2B) may cause reflected light 41 that results in signal loss. In order to correct the above problem, a lens 42 is inserted at the top portion 16 of the elevator tube 12 and is held in place via, for example, the spider collar 14 (not shown) at distance from the wafer that ideally is the lens focal length (e.g., about 50 mm), as illustrated in prior art FIG. 2C. The lens 42 re-collects 44 any reflected light 41 that would otherwise not return to the pyrometer head 22. The lens 42 thus allows or corrects for reflections due to warpage or offset, thus facilitating use of the pyrometer with both polished or roughed backside wafers.

Although the pyrometer system 10 having the lens 42 provides relatively good results, there is a continuing need in the art for further refinements and improvements in pyrometry in order to provide high temperature determination accuracy for rapid thermal process control.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In accordance with one aspect of the present invention a pyrometer system and temperature sensing method is disclosed that overcomes several disadvantages associated with the prior art. In particular, a pyrometer having an elevator tube comprising two tubes in a generally telescopic arrangement is disclosed. A cooling gas is introduced in a fluid passageway between the tubes to provide directed cooling to a portion of the wafer or work piece being sensed. The radiation to and from the wafer during analysis occurs within the inner tube and is substantially isolated from the cooling gas, and thus any stratification of gas within the inner tube is independent of changes in the cooling gas flow rate. Further, the inner tube may be evacuated to substantially prevent stratification therein and thereby further improve the optical path of the pyrometer.

In accordance with another aspect of the present invention, a pyrometer system is disclosed comprising an elevator tube having a pyrometer head associated with a bottom portion and a sleeve associated with a top portion thereof. A lens is coupled to the sleeve and is operable to focus radiation/light from a work piece to the pyrometer head. The lens has a focal length that is related to the distance of the work piece therefrom, and the focal length is a function of temperature. The sleeve that is coupled to the lens has a coefficient of thermal expansion that varies the distance between the lens and the work piece as temperature varies in order to compensate for changes in the focal length due to temperature variations. Accordingly, the lens in conjunction with the sleeve is operable to transmit light from the work piece to the pyrometer head without substantial signal loss, thereby improving pyrometer system accuracy.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the drawings wherein like reference numerals are used to refer to like elements throughout. The present invention is directed to a pyrometer system and associated method that provides improvements over the prior art.

In one aspect of the invention, the conventional elevator tube is replaced with two concentrically arranged tubes having a fluid passageway therebetween. Cooling gas is provided in the fluid passageway between the tubes, but not in the inner tube, thereby preventing a stratification of gas within the inner tube to vary substantially with respect to changes in the cooling gas flow rate. Further, the inner tube may be fluidly sealed and evacuated in order to substantially prevent stratification therein to improve the optical path. In another aspect of the invention, a top portion of the elevator tube comprises a sleeve that is coupled to a lens. The sleeve has a coefficient of thermal expansion that operates to compensate for changes in the focal length of the lens over temperature, thereby improving the accuracy of the pyrometer temperature measurement.

Figure 3:
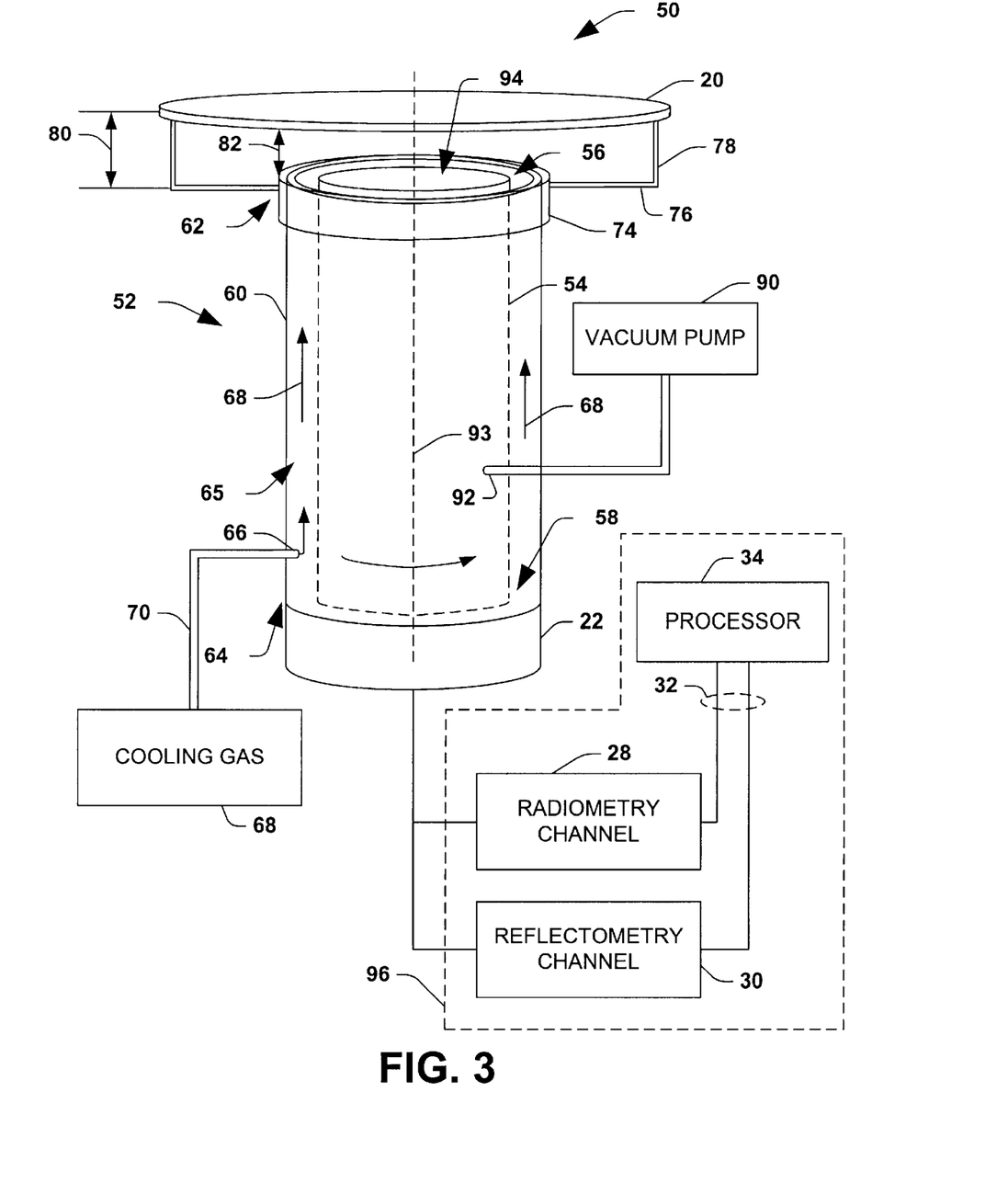
FIG. 3 is a combined perspective view and block diagram of a pyrometer system in accordance with one aspect of the present invention.

Turning now to the figures, FIG. 3 is a combined perspective view and block diagram illustrating a pyrometer system 50 in accordance with one aspect of the present invention. In some respects, the pyrometer system 50 is similar to the system 10 of prior art FIG. 1; however, the conventional elevator tube 12 is replaced with a new type of tube structure 52. The elevator tube 52 of the present invention comprises an inner tube 54 that extends from a top 56 to a bottom 58 thereof. In one example, the inner tube 54 extends an entire length of the tube 52 (e.g., about 1 m). The elevator tube 52 further comprises an outer tube 60 that in one example surrounds the inner tube 54 concentrically in a telescoping type arrangement, as illustrated. The outer tube 60 also extends from a top 62 to a bottom 64 and may be co-extensive with the inner tube 54 as shown.

The concentric nature of the inner and outer tubes 54, 60 define a fluid passageway 65 therebetween. A cooling gas port 66 couples to or is otherwise associated with the outer tube 60 in order for a cooling gas 68 to be delivered into the passageway 65 via a gas line 70. The cooling gas 68 generally flows through the passageway 65 toward the top 56, 62 of the inner and outer tubes 54, 60 in order to provide cooling to one or more selected portions of a work piece such as the semiconductor wafer 20. Note that in FIG. 3, the cooling gas 68 exits the tube 52 in a concentric manner, however, fluid direction devices (as will be discussed in greater detail infra) may be employed to direct the cooling gas to one or more portions of the work piece 20 in a controlled fashion.

The pyrometer system 50 further comprises a spider collar 74 which is coupled to or otherwise associated with a top portion of the elevator tube 52. For example, in FIG. 3, the spider collar 74 is coupled to the top 62 of the outer tube 60; however, it may be coupled to the inner tube 54 and such alternatives are contemplated as falling within the scope of the present invention. The spider collar 74 has a plurality of arms 76 having vertically extending pins 78 associated therewith, wherein a length 80 of the pins 78 defines a distance 82 (e.g., about 50 mm) between the work piece 20 and the elevator tube 52.

In accordance with another aspect of the present invention, the pyrometer system 50 of FIG. 3 further comprises a vacuum pump 90 which is coupled to or otherwise associated with the inner tube 54 via an access portion 92. By fluidly sealing the inner tube 54 at the top 56 and bottom 58 thereof, the vacuum pump 90 may be employed to evacuate the inner tube 54 which contains the optical axis 93 for the pyrometer head 22 located at the tube bottom. The pyrometer head 22 in turn is operably coupled to a control system 96 that includes the radiometry channel 28, reflectometry channel 30 and processor 34 as discrete or integrated components.

In order to appreciate the advantageous features of the present invention, a brief discussion will be provided regarding a shortcoming of the prior art that was appreciated by the inventors of the present invention. In the prior art elevator tube 12, the cooling gas therein produces a gas column having a radial and axial temperature gradient, wherein the gradient is not static, but rather is a function of the gas volume flow rate. The temperature gradient in turn causes a dynamic gas density gradient within the tube 12 which causes a dynamic index of refraction gradient for light traveling within the tube between the work piece 20 and the pyrometer head 22. This "gradient index lens" in the tube results in distortions of the radiometry signal and the reflectometry signal, respectively.

In some instances, compensation can be provided to compensate for the gradient in the tube; however, when the gas flow rate is not constant (e.g., the gas flow rate may frequently change to accommodate varying process conditions), the gas density gradient in the tube 12 varies, thus causing the index of refraction gradient in the tube to also vary undesirably, thus making compensation for signal distortions extremely difficult or impossible.

In appreciation of the above problem, the inventors of the present invention provide the pyrometer system 50 having the concentric multi-tube elevator tube 52 having the fluid passageway therebetween. The cooling gas 68 is provided into the fluid passageway 65 while the inside of the inner tube 54 is fluidly isolated therefrom. Therefore in the system 50 of the present invention, a stratification of the ambient environment within the inner tube 54 may still occur, but such stratification will not be a function of changes in the cooling gas volume flow rate. Therefore compensation may be provided due to such stratification since the distortion caused by the stratification will remain substantially constant.

In accordance with another aspect of the present invention, the vacuum pump 90 is coupled to or otherwise associated with the inner tube 54 that is fluidly sealed at the top 56 and bottom 58 thereof via the port 92. The vacuum pump 90 is operable to evacuate the inner tube 54, thereby generating a vacuum therein. With a vacuum within the inner tube 54, no stratification exists therein, thereby establishing a substantially high quality optical path 94 therethrough. With no stratification associated with the optical path the light signals for the radiometry channel 28 and the reflectometry channel 30 have substantially no distortion, thereby making such measurements substantially more precise without the need for compensation.

Figure 4:
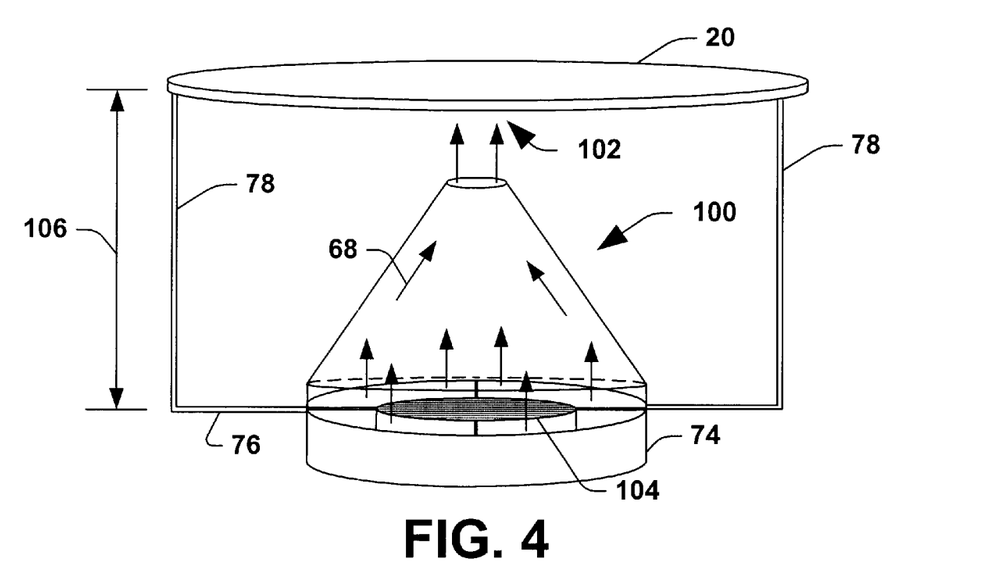
FIG. 4 is a perspective view of a fluid direction device associated with a pyrometer system in accordance with another aspect of the present invention.

Turning now to FIG. 4, a fluid direction device 100 is illustrated in accordance with another aspect of the present invention. The fluid direction device 100 is associated with the top of the elevator tube 52, for example, coupled to one or more of the inner or outer tubes 54 and 60 and/or the spider collar 74. In the example of FIG. 4, the fluid direction device 100 comprises a frustum shaped device and is coupled to the spider collar 74, and is operable to direct cooling gas 68 flowing between the inner and outer tubes 54 and 60 to a predetermined portion 102 of the wafer 20 to provide localized cooling thereat. Although the fluid direction device 100 in the present example is illustrated as a truncated, inverted cone, it should be understood that other shapes and structures may be employed and that any such structure operable to direct cooling gas to one or more predetermined portions of the wafer 20 are contemplated as falling within the scope of the present invention.

In addition, in FIG. 4 a lens 104 (e.g., made of quartz or sapphire) is situated at the top portion 56 of the inner tube 54. The lens 104 preferably fluidly isolates the interior of the inner tube 54 from the cooling gas 68, thereby preventing any stratification of gas within the inner tube from being a function of changes in the cooling gas flow rate. Further, by sealing the inner tube 54, one may evacuate the inner tube 54 to substantially prevent any stratification therein. The lens 104, in addition to sealing the inner tube 54, also serves to focus light/radiation from the wafer 20 to the pyrometer head 22 in an effective manner as discussed previously. A distance 106 between the wafer 20 and the lens 104 preferably is equal to the focal length of the lens and is, in the present example, dictated by the spider arms 76, 78 associated with the spider collar 74.

In accordance with another aspect of the present invention, the elevator tube comprises a sleeve associated with a top portion thereof. As will be discussed below in greater detail, the sleeve supports the lens, and has a coefficient of thermal expansion that alters the distance between the lens and the wafer or work piece as a function of temperature. As will be further appreciated, such changes in the distance act to compensate for changes in the focal length of the lens that also varies with respect to temperature. In the above manner, the sleeve in conjunction with the lens serve to image radiation from the wafer down to the pyrometer head in a substantially consistent manner despite variations in temperature.

Figure 5:
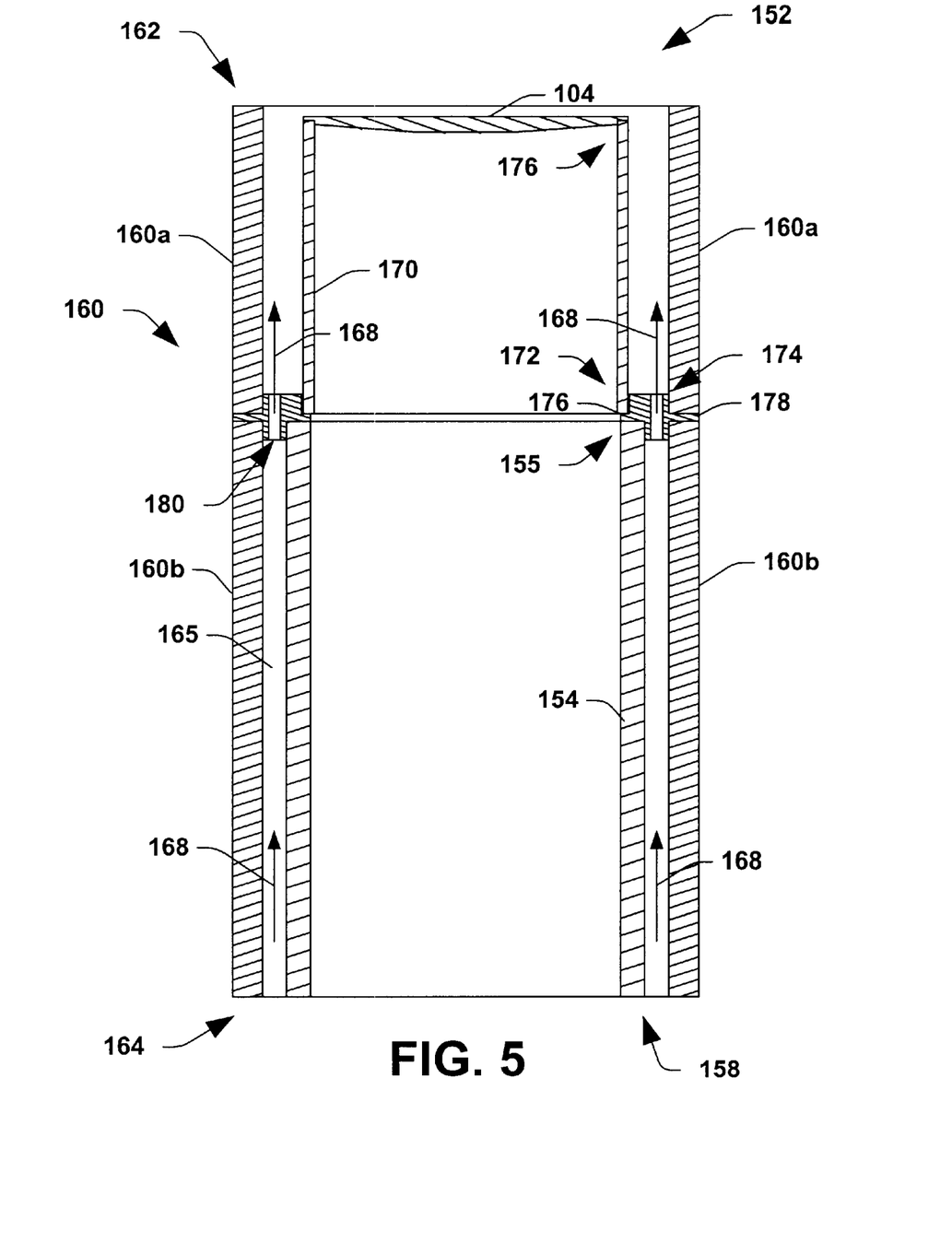
FIG. 5 is a cross section diagram illustrating an elevator tube structure for a pyrometer system in accordance with yet another aspect of the present invention.

FIG. 5 is a cross sectional view of an elevator tube 152 in accordance with still another aspect of the present invention. The elevator tube 152 may be employed, for example, in the pyrometer system 50 of FIG. 3 or in other type systems, as may be desired. The elevator tube 152 is similar in some ways to the tube 52 of FIG. 3, but differs in several respects. The elevator tube 152 of FIG. 5 comprises an inner tube 154 that extends from an intermediate portion 155 of the tube to a bottom 158 thereof. In one example, the inner tube 154 extends a substantial length of the entire tube 152, but may vary as desired.

The elevator tube 152 further comprises an outer tube 160 that surrounds the inner tube 154 concentrically in a telescoping type arrangement, as illustrated. The outer tube 160 extends from a top 162 to a bottom 164 as shown. The concentric nature of the inner and outer tubes 154,160 define a fluid passageway 165 therebetween. A cooling gas port (not shown) couples to or is otherwise associated with the outer tube 160 for delivery of a cooling gas 168 into the passageway 165 via, for example, a gas line (not shown).

The elevator tube 152 further comprises a sleeve 170 associated with the intermediate portion 155 of the inner tube 154. The sleeve 170 has a bottom portion that engages a ring seal 174 that separates the outer tube 160 into a top portion 160a and a bottom portion 160b, respectively. The sleeve 170 further includes a top portion 176 that supports or is otherwise associated with the lens 104.

In one exemplary aspect of the present invention, the sleeve 170 comprises a material such as sapphire ($Al_2O_3$) or alumina (amorphous $Al_2O_3$) that exhibits a coefficient of thermal expansion that causes the distance 106 (see, e.g., FIG. 4) between the lens 104 and the wafer 20 to change with respect to changes in temperature. More preferably, an amount of change in the distance 106 due to a change in temperature generally corresponds to a change in the focal length of the lens 170 due to the same temperature change.

Therefore if a change in temperature ($\Delta T$) causes a change in the focal length ($\Delta f$) of the lens 104, the sleeve 170 exhibits a coefficient of thermal expansion that alters the distance 106 ($\Delta D$), wherein $\Delta f \approx \Delta D$. In the above manner, the imaging of radiation from the wafer 20 by the lens 104 to the pyrometer head 22 is substantially the same over a large temperature range, thereby improving the accuracy of the pyrometer system. Although sapphire and alumina are presented as exemplary materials for the sleeve 170, any material that provides such a coefficient of thermal expansion may be employed and such materials are contemplated as falling within the scope of the present invention.

In the present example, the spider collar (not shown) which supports the wafer 20 at the predetermined distance 106 from the lens 104 is made of quartz which has a substantially smaller coefficient of thermal expansion than that of the sleeve 170 (e.g., 1:10) such that variations in distance due to temperature may be considered negligible. Alternatively, although the present example illustrates a sleeve 170 that exhibits the substantial coefficient of thermal expansion while the wafer 20 is held relatively still with respect to the elevator tube 152, the present invention also contemplates holding the lens 104 in a relatively fixed position while using a spider collar support structure that exhibits a substantial coefficient of thermal expansion to compensate for the change in lens focal length. This alternative solution, however, may not be as desirable since any substantial movement of the support structure may result in a variation in the desired heating of the work piece located thereon.

Referring still to FIG. 5, the ring seal 174 may comprise an annular seal that couples together the various portions 154, 160a, 160b and 170 of the elevator tube 152. More particularly, in the present example the ring seal 174 comprises an inner concentric portion 176 that couples together the inner tube 154 and the sleeve 170, and an outer concentric portion 178 that couples together the top and bottom portions of the outer tube 160a and 160b, respectively. The ring seal 174 further comprises an annular hole 180 through which the cooling gas 168 passes to provide localized cooling to the wafer (not shown), as described supra. Alternatively, the ring seal hole 180 may comprise one or more apertures of various shapes and/or sizes about the annular seal, as may be desired.

In accordance with yet another aspect of the present invention, the sleeve 170 is substantially opaque with respect to radiation, or at least is diffuse with respect thereto. By making the sleeve substantially opaque or diffuse, stray light such as light reflected from the bell jar (not shown) that would otherwise be imaged undesirably by the lens 104 is substantially reduced or altogether eliminated. For example, if the sleeve 170 is composed of sapphire, the sapphire sleeve may be "frosted" by dipping the sleeve into an HF or equivalent solution. Alternatively, the outer surface or "OD" of the sleeve 170 may be ground to a predetermined finish. Any suitable sleeve material may be employed, and any suitable frosting process may be utilized to achieve the above structure and such alternatives are contemplated as falling within the scope of the present invention.

Figure 6:
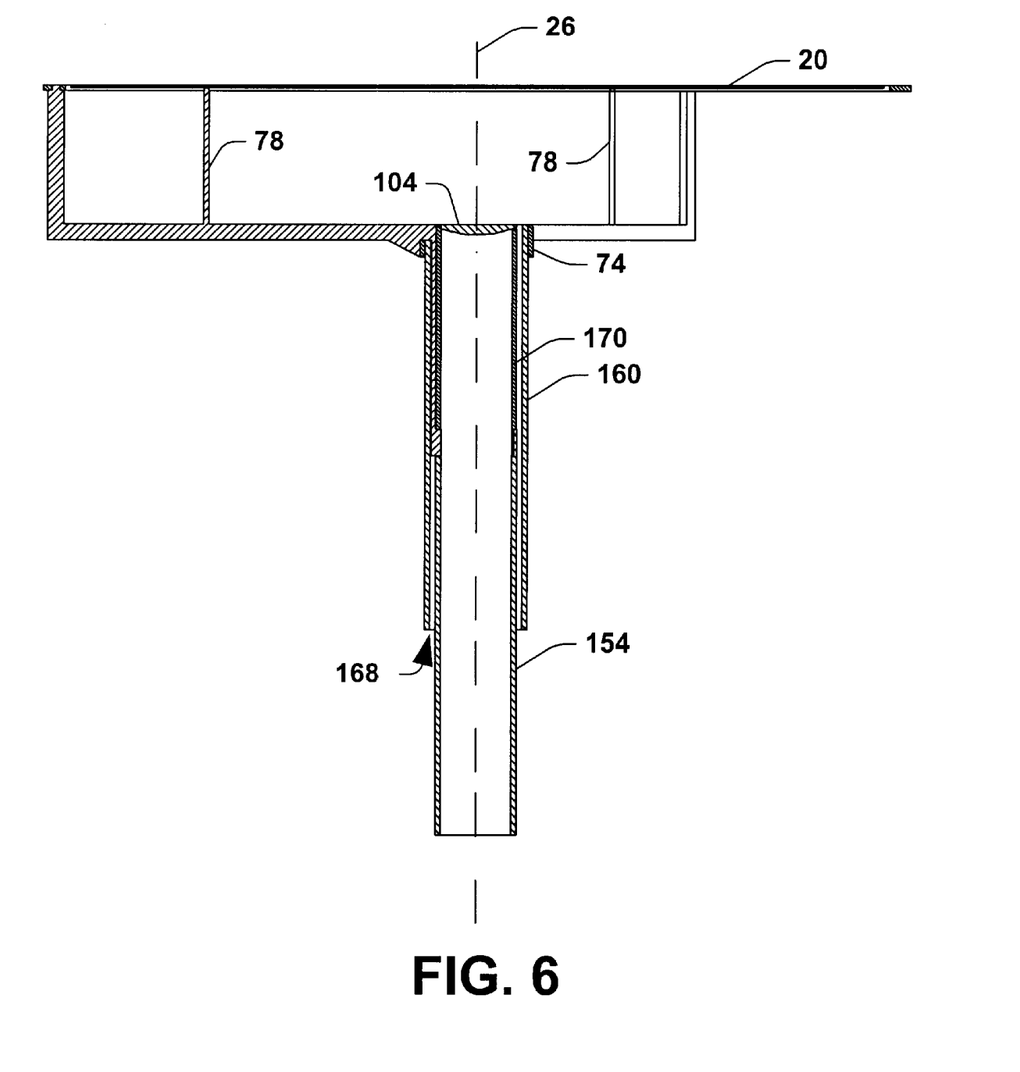
FIG. 6 is a cross section diagram illustrating an elevator tube structure and spider collar for supporting a work piece in accordance with still another aspect of the present invention.

FIG. 6 is another cross section illustrating additional exemplary details relating to the elevator tube 152 of FIG. 5 into a portion of a pyrometer system such as the system 50 of FIG. 3, having the sleeve 170 and the spider collar 74 as described previously. In addition, although not shown in FIG. 6, the fluid direction structure 100 or similar structure may be employed in conjunction with the tube 152 for localized cooling or one or more portions of the work piece 20, as may be desired.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising".

What is claimed is:

1. A pyrometer system, comprising:
   an elevator tube, comprising:
   an inner tube extending from a top to a bottom thereof; and
   an outer tube surrounding the inner tube in telescoping arrangement and extending from a top to a bottom thereof, and defining a fluid passageway between the inner and outer tubes;
   a port associated with the outer tube, and operable to transmit a cooling gas therethrough into the fluid passageway;
   a pyrometer head coupled to the bottom of the inner tube, and operable to transmit and receive radiation through the inner tube; and
   a spider collar coupled to at least one of a top of the inner tube or outer tube, and operable to support a work piece.

2. The pyrometer system of claim 1, wherein the bottom of the inner tube and the outer tube are fluidly sealed local to the pyrometer head to fluidly isolate an interior of the inner tube from the fluid passageway.

3. The pyrometer system of claim 1, further comprising a lens positioned at the top of the inner tube and substantially fluidly isolating an interior of the inner tube at the top thereof.

4. The pyrometer system of claim 1, further comprising a fluid direction device associated with the top of at least one of the inner tube and the outer tube, wherein the fluid direction device is operable to direct the cooling gas from the fluid passageway to a predetermined area of the work piece.

5. The pyrometer system of claim 4, wherein the fluid direction device comprises a substantially radiation transparent frustum shaped cone having a first area at a base portion and a second area at an end portion, and wherein the base portion is coupled to the spider collar, the first area is larger than the second area, and the first area is sufficiently large to direct the cooling gas from the fluid passageway to a wafer area associated with the second area of the end portion of the cone.

6. The pyrometer system of claim 1, wherein the inner tube is fluidly isolated from the fluid passageway.

7. The pyrometer system of claim 6, further comprising:
   a port associated with the inner tube; and
   a vacuum pump operable to connect to the port associated with the inner tube, and generate a vacuum within the inner tube.

8. The pyrometer system of claim 1, wherein the spider collar is coupled to the top of the outer tube, further comprising:
   a sleeve having a bottom portion coupled to the top of the inner tube and extending therefrom to a top portion thereof; and
   a lens coupled to the top portion of the sleeve and positioned a predetermined distance from the work piece when supported by the spider collar,
   wherein the sleeve has a coefficient of thermal expansion that causes the sleeve to thermally expand with an increase in temperature and thereby alter the predetermined distance between the lens and the work piece, and wherein the lens has a focal length that decreases with an increase in temperature, and wherein the sleeve provides compensation in the predetermined distance for changes in the focal length of the lens due to variations in temperature.

9. The pyrometer system of claim 8, wherein the top portion of the sleeve substantially covers a side portion of the lens, and wherein the sleeve is substantially opaque to radiation, thereby reducing an amount of stray light from reflecting off the lens and into the elevator tube.

10. The pyrometer system of claim 8, further comprising a ring seal coupled between the top of the inner tube and the bottom portion of the sleeve in an inner concentric portion, and coupled between a lower portion and an upper portion of the outer tube in an outer concentric portion, and having an annular hole in a center portion corresponding to the fluid passageway for permitting the cooling gas to pass therethrough.

11. The pyrometer system of claim 1, further comprising a processor coupled to the pyrometer head, wherein the processor is operable to receive radiation intensity data and reflectivity data associated with a radiometry channel and a reflectometry channel, respectively, and calculate a wafer temperature in accordance therewith.

12. The pyrometer system of claim 11, wherein the processor is further operable to extract a wafer emissivity from the reflectivity data and calculate the wafer temperature using the radiation intensity data and the wafer emissivity.

13. A pyrometer system, comprising:
    an elevator tube having a top portion and a bottom portion associated therewith;
    a pyrometer head associated with the bottom portion of the elevator tube, and operable to transmit and receive radiation through the tube;
    a sleeve associated with the top portion of the elevator tube; and
    a lens coupled to the sleeve, the lens having a focal length associated therewith which is related to a distance of a work piece positioned therefrom, wherein the focal length is a function of temperature, and
    wherein the sleeve has a coefficient of thermal expansion, and wherein the sleeve alters the distance between the lens and the work piece due to the coefficient of thermal expansion as a function of temperature to compensate for changes in the focal length of the lens due to variations in temperature.

14. The pyrometer of claim 13, wherein the tube comprises an elevator tube.

15. The pyrometer of claim 14, further comprising a spider collar coupled to the top portion of the elevator tube, the spider collar comprising a plurality of pins operable to support the work piece thereon, and operable to secure the lens in a position which is a predetermined distance from the work piece at a predetermined temperature.

16. The pyrometer of claim 15, wherein the spider collar comprises a material having a coefficient of thermal expansion that is substantially less than that of the sleeve.

17. The pyrometer system of claim 16, wherein the spider collar comprises quartz and the sleeve comprises $Al_2O_3$, and wherein the coefficient of thermal expansion of the sleeve is about ten times greater than that of the spider collar.

18. The pyrometer system of claim 17, wherein the $Al_2O_3$ sleeve comprises one of crystalline $Al_2O_3$ and amorphous $Al_2O_3$.

19. The pyrometer system of claim 13, wherein the sleeve is substantially opaque to radiation, thereby reducing an amount of stray light from reflecting off the lens and into the elevator tube.

20. The pyrometer system of claim 14, wherein the elevator tube further comprises:

an inner tube extending from a top to a bottom thereof, and engaging the sleeve at the top thereof; and an outer tube surrounding the inner tube and the sleeve in telescoping arrangement and extending from a top to a bottom thereof, and defining a fluid passageway therebetween; and a port associated with the outer tube, and operable to transmit a cooling gas therethrough into the fluid passageway, wherein the pyrometer head is coupled to the bottom of the inner tube, and is operable to transmit and receive radiation through the inner tube.

21. The pyrometer system of claim 20, further comprising a spider collar coupled to at least one of a top of the inner tube or outer tube, and operable to support a work piece at a predetermined distance from the lens.

22. The pyrometer system of claim 20, wherein the bottom of the inner tube and the outer tube are fluidly sealed local to the pyrometer head to fluidly isolate an interior of the inner tube from the fluid passageway.

23. The pyrometer system of claim 20, wherein the lens is positioned within the sleeve and substantially fluidly isolates an interior of the inner tube.

24. The pyrometer system of claim 23, further comprising:

a port associated with the inner tube; and a vacuum pump operable to connect to the port associated with the inner tube, and generate a vacuum within the inner tube.

25. The pyrometer system of claim 20, further comprising a fluid direction device associated with the top of at least one of the inner tube and the outer tube, wherein the fluid direction device is operable to direct the cooling gas from the fluid passageway to a predetermined area of the work piece.

26. The pyrometer system of claim 25, wherein the fluid direction device comprises a substantially radiation transparent frustum shaped cone having a first area at a base portion and a second area at an end portion, and wherein the base portion is coupled to the spider collar, the first area is larger than the second area, and the first area is sufficiently large to direct the cooling gas from the fluid passageway to a wafer area associated with the second area of the end portion of the cone.

27. The pyrometer system of claim 20, further comprising a ring seal coupled between the top of the inner tube and the bottom portion of the sleeve in an inner concentric portion, and coupled between a lower portion and an upper portion of the outer tube in an outer concentric portion, and having an annular hole in a center portion corresponding to the fluid passageway for permitting the cooling gas to pass therethrough.

* * * * *